United States Patent
Gangopadhya (10) Patent No.: US 10,158,355 B2
(45) Date of Patent: Dec. 18, 2018

(54) SYSTEM AND METHOD FOR INRUSH CURRENT CONTROL FOR POWER SOURCES USING NON-LINEAR ALGORITHM

(71) Applicant: Raytheon Company, Waltham, MA (US)

(72) Inventor: Robin Gangopadhya, La Crescenta, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/385,225

(22) Filed: Dec. 20, 2016

(65) Prior Publication Data

US 2018/0175852 A1    Jun. 21, 2018

(51) Int. Cl.
H03K 3/00 (2006.01)
H03K 17/16 (2006.01)

(52) U.S. Cl.
CPC ......... *H03K 17/165* (2013.01); *H03K 17/168* (2013.01)

(58) Field of Classification Search
CPC .................................................. H03K 17/165
See application file for complete search history.

(56) References Cited

U.S. PATENT DOCUMENTS

| | | |
|---|---|---|
| 2003/0107322 A1 | 6/2003 | Melvin et al. |
| 2006/0267665 A1 | 11/2006 | Kawamoto |
| 2007/0007929 A1* | 1/2007 | Lee .................. H02M 7/53875 318/802 |
| 2013/0257177 A1 | 10/2013 | Jacobson et al. |
| 2015/0057822 A1 | 2/2015 | Baldridge |

FOREIGN PATENT DOCUMENTS

EP     2385628 A2     11/2011

OTHER PUBLICATIONS

Vishay, "Solid-State Relays Frequently Asked Questions (FAQs)", Jul. 15, 2016, retrieved from https://www.vishay.com/docs/84399/solidstaterelaysfaqs.pdf on Nov. 14, 2017, 4 pages.

(Continued)

*Primary Examiner* — Daniel Puentes (57) ABSTRACT

A method includes determining an initial voltage level and duration for an input voltage of a gate of each of multiple transistor devices. Each transistor device receives a power input and controls a current passing through the transistor device. The method also includes controlling the input voltage of the gate of each transistor device according to the initial voltage level and duration. The method further includes receiving real-time feedback including at least one of a present value of the current passing through each transistor device, a present voltage of the power input, and a present value of a capacitor voltage. The method also includes determining, based on the feedback, a subsequent voltage level and duration for the gate of each transistor device. In addition, the method includes controlling the input voltage of the gate of each transistor device according to the determined subsequent voltage level and duration.

20 Claims, 6 Drawing Sheets

(56) References Cited

OTHER PUBLICATIONS

International Search Report and Written Opinion of the International Searching Authority in PCT Patent Application No. PCT/US2017/047022 dated Nov. 24, 2017, 18 pages.

Marinko Stojkov, et al., "New Possibilities in Inrush Current Phenomena Analysis," vol. 1, Issue 3, J Elec Electron 1:e108. doi:10.4172/2167-101X.1000e108, Nov. 14, 2012, 3 pages.

Greg Cecil, "Microcircuit, Hybrid, Linear, Single Channel, Inrush Current Protection Module," 11 pages, Aug. 17, 2016, publisher DLA Land and Maritime, Columbus, OH.

Eleni Manousaka, "DC-DC Buck Converter with Inrush Current Limiter," Master Thesis Project, Oct. 2013, 157 pages.

Masashi Kitayama, "A New Approach to Fast Inrush Current Discrimination Based on Transformer Magnetizing Characteristics," 14th PSCC, Sevilla, Jun. 24-28, 2002, Session 42, Paper 2, 7 pages.

Electronic Design, "Limit Inrush Current in AC-DC Power Supplies and Rectifiers," Jul. 8, 2015, 10 pages, available at http://electronicdesign.com/power/limit-inrush-current-ac-dc-power-supplies-and-rectifiers.

Ali Asghar Fathollahi Fard, "Help of Microcontroller on Voltage Control to Reduce Transformer Inrush Current," DOI: 10.4313/TEEM.2014.15.112, vol. 15, No. 1, Transactions on Electrical and Electronic Materials, Feb. 25, 2014, 12-15 pages, publisher KIEEME, Seoul, Korea.

C. S. Mitter, "Active Inrush Current Limiting Using MOSFETs," AN1542, 1995, 14 pages, publisher Motorola, Inc., Phoenix, AZ.

\* cited by examiner

SYSTEM AND METHOD FOR INRUSH CURRENT CONTROL FOR POWER SOURCES USING NON-LINEAR ALGORITHM

TECHNICAL FIELD

This disclosure is directed in general to control of power systems. More specifically, this disclosure relates to a system and method for inrush current control for power sources using a non-linear algorithm.

BACKGROUND

In power systems deriving power from a source, there is often a large initial or "inrush" current drawn during each turn-on event. This is typically a result of the presence of inductors and capacitors in the input stage of a power system. In many cases, the magnitude of the inrush current can be as high as $V_{peak}(\text{input})/Z$, where Z represents the overall impedance (inductance-capacitance) of the input stage. This inrush current can be undesirable for various reasons, such as by causing component overheating, component failures, or shorter component lifespans. Electromagnetic interference (EMI) caused during such turn-on events is often undesirable.

SUMMARY

This disclosure provides a system and method for inrush current control for power sources using a non-linear algorithm.

In a first embodiment, a method includes determining an initial voltage level and an initial duration for an input voltage of a gate of each of multiple transistor devices. Each transistor device is configured to receive a power input and control a current passing through the transistor device, and the current is associated with the power input. The method also includes controlling the input voltage of the gate of each transistor device according to the determined initial voltage level and initial duration. The method further includes receiving real-time feedback including at least one of a present value of the current passing through each transistor device, a present voltage of the power input, and a present value of a capacitor voltage downstream of the transistor devices. The method also includes determining, based on the received feedback, a subsequent voltage level and subsequent duration for the gate of each transistor device. In addition, the method includes controlling the input voltage of the gate of each transistor device according to the determined subsequent voltage level and subsequent duration.

In a second embodiment, a system includes a plurality of transistor devices and a controller. Each transistor device is configured to receive a power input and control a current passing through the transistor device, where the current is associated with the power input. The controller is configured to determine an initial voltage level and an initial duration for an input voltage of a gate of each transistor device. The controller is also configured to control the input voltage of the gate of each transistor device according to the determined initial voltage level and initial duration. The controller is further configured to receive real-time feedback including at least one of a present value of the current passing through each transistor device, a present voltage of the power input, and a present value of a capacitor voltage downstream of the transistor devices. The controller is also configured to determine, based on the received feedback, a subsequent voltage level and subsequent duration for the gate of each transistor device. In addition, the controller is configured to control the input voltage of the gate of each transistor device according to the determined subsequent voltage level and subsequent duration.

In a third embodiment, a non-transitory computer readable medium contains instructions that, when executed by at least one processing device, cause the at least one processing device to determine an initial voltage level and an initial duration for an input voltage of a gate of each of multiple transistor devices. Each transistor device is configured to receive a power input and control a current passing through the transistor device, and the current is associated with the power input. The medium also contains instructions that, when executed by the at least one processing device, cause the at least one processing device to control the input voltage of the gate of each transistor device according to the determined initial voltage level and initial duration. The medium further contains instructions that, when executed by the at least one processing device, cause the at least one processing device to receive real-time feedback including at least one of a present value of the current passing through each transistor device, a present voltage of the power input, and a present value of a capacitor voltage downstream of the transistor devices. The medium also contains instructions that, when executed by the at least one processing device, cause the at least one processing device to determine, based on the received feedback, a subsequent voltage level and subsequent duration for the gate of each transistor device. In addition, the medium contains instructions that, when executed by the at least one processing device, cause the at least one processing device to control the input voltage of the gate of each transistor device according to the determined subsequent voltage level and subsequent duration.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 7, described below, and the various embodiments used to describe the principles of the present disclosure in this patent document are by way of illustration only and should not be construed in any way to limit the scope of the disclosure. Those skilled in the art will understand that the principles of the present disclosure may be implemented in any type of suitably arranged device or system.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and is not meant to imply that the feature or component cannot be employed in the embodiments described in connection with that figure.

Figure 1:
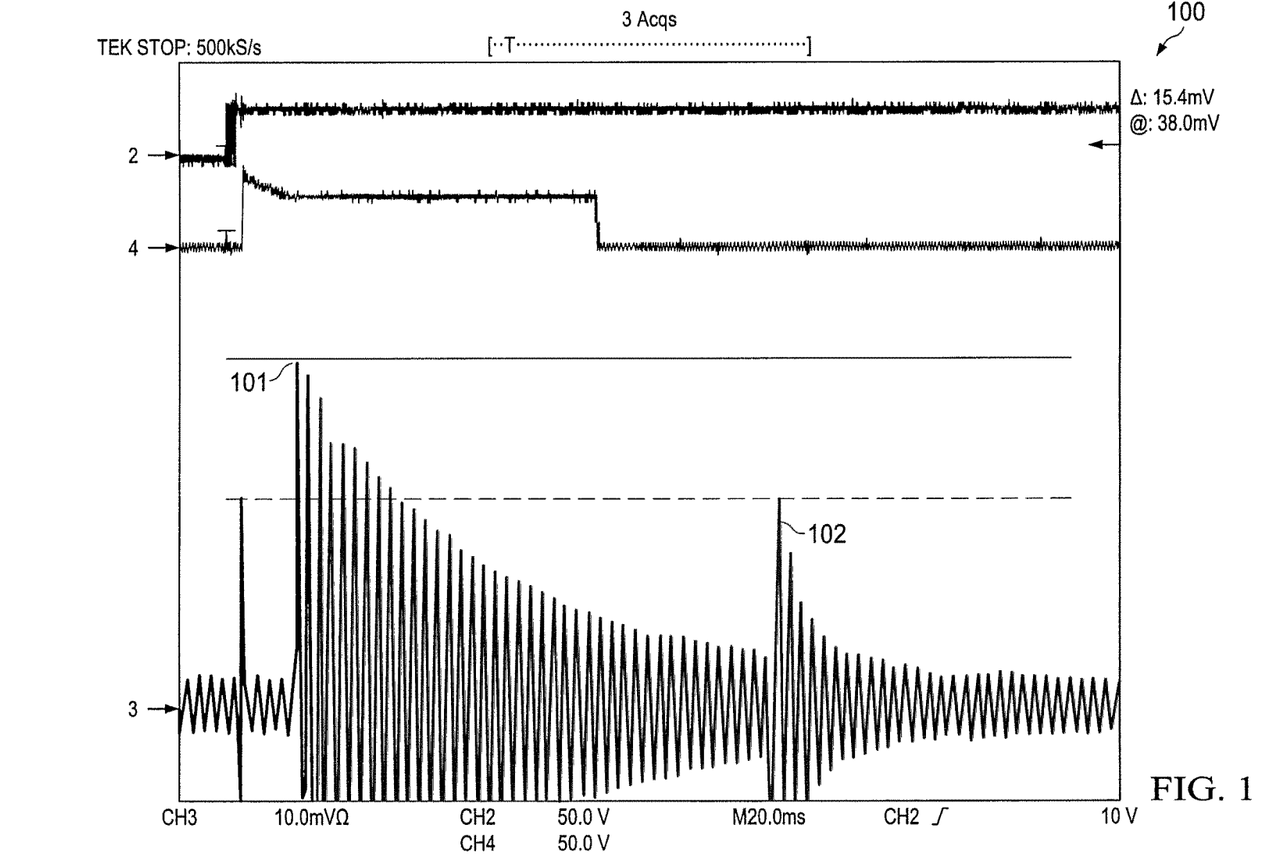
FIG. 1 illustrates an example chart showing the presence of inrush current at an input stage of a power system.

As previously discussed, in many power systems, there is typically a large initial current (often referred to as "inrush current") drawn during each turn-on event as a result of the presence of inductors and capacitors in the input stage of the power system. FIG. 1 illustrates an example chart 100 showing the presence of inrush current at an input stage of a power system. The power system here denotes a 20 kW alternating current (AC) power system. Current spikes 101-102 represent inrush currents that occur at transient times in the power system. These inrush currents can occur in a variety of power systems, such as high-voltage (HV) direct current (DC) systems and HV three-phase AC systems that are common in aerospace applications. The inrush currents are undesirable for various reasons, such as by causing component overheating, component failures, or shorter component lifespans.

Figure 2:
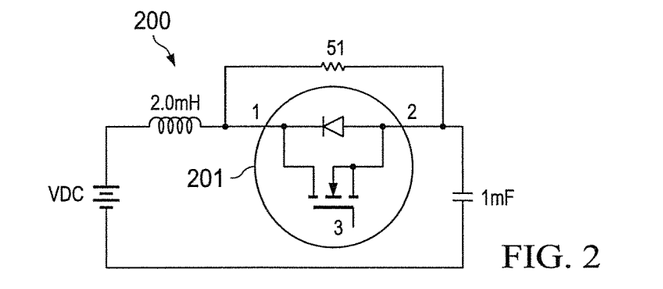
FIG. 2 illustrates an example system for controlling inrush current.

Conventional attempts have been made to control inrush currents using resistive loads, shunt switches, or other components. FIG. 2 illustrates an example system 200 for controlling inrush currents. The system 200 includes a switch 201 that can be selectively turned on and off to limit the inrush currents. However, the switch 201 is controlled in an open loop without any feedback or any a priori control.

Other conventional systems limit inrush currents by adding one or more current limiting dissipative linear or non-linear components, such as resistors, negative-temperature coefficient (NTC) devices, or positive-temperature coefficient (PTC) devices. These components are bypassed after an arbitrary time, typically ranging from several to tens of milliseconds. Peak power dissipation in these systems can be very high with a concurrent temperature rise in these components. While this bypassing method eliminates dissipative limiting components in the current draw path, the circuitry used in these systems tends to be bulky, slow, and prone to damage due to repeated on/off cycles. In many systems, a constraint limits how often turn-on events can occur in order to keep a local temperature rise below levels not detrimental to the integrity of the associated device or system. Moreover, these systems are typically low-voltage DC capable only. For example, many of these types of systems are limited to an 80V peak, with 48V being a typical application voltage.

Still other conventional systems have attempted to control inrush currents using a microcontroller at a simple input stage. However, these systems often use a resistor in series with a capacitor. This approach can fail under many adverse applications in aerospace HV environments, including failure to meet electromagnetic interference (EMI) test requirements.

To address these or other issues, embodiments of this disclosure provide a system and method for inrush current control using a non-linear approach by using the inherent controllable resistive region of metal oxide semiconductor field effect transistor (MOSFET) devices. The disclosed techniques reduce or eliminate problems such as ad hoc current limits, arbitrary durations, and turn-on event limits. The disclosed techniques adaptively control an input current and allow repeated turn-on events.

It will be understood that embodiments of this disclosure may include any one, more than one, or all of the features described here. Also, embodiments of this disclosure may additionally or alternatively include other features not listed here. While the disclosed embodiments may be described with respect to power systems in certain applications, these embodiments are also applicable in any other suitable systems or applications.

Figure 3:
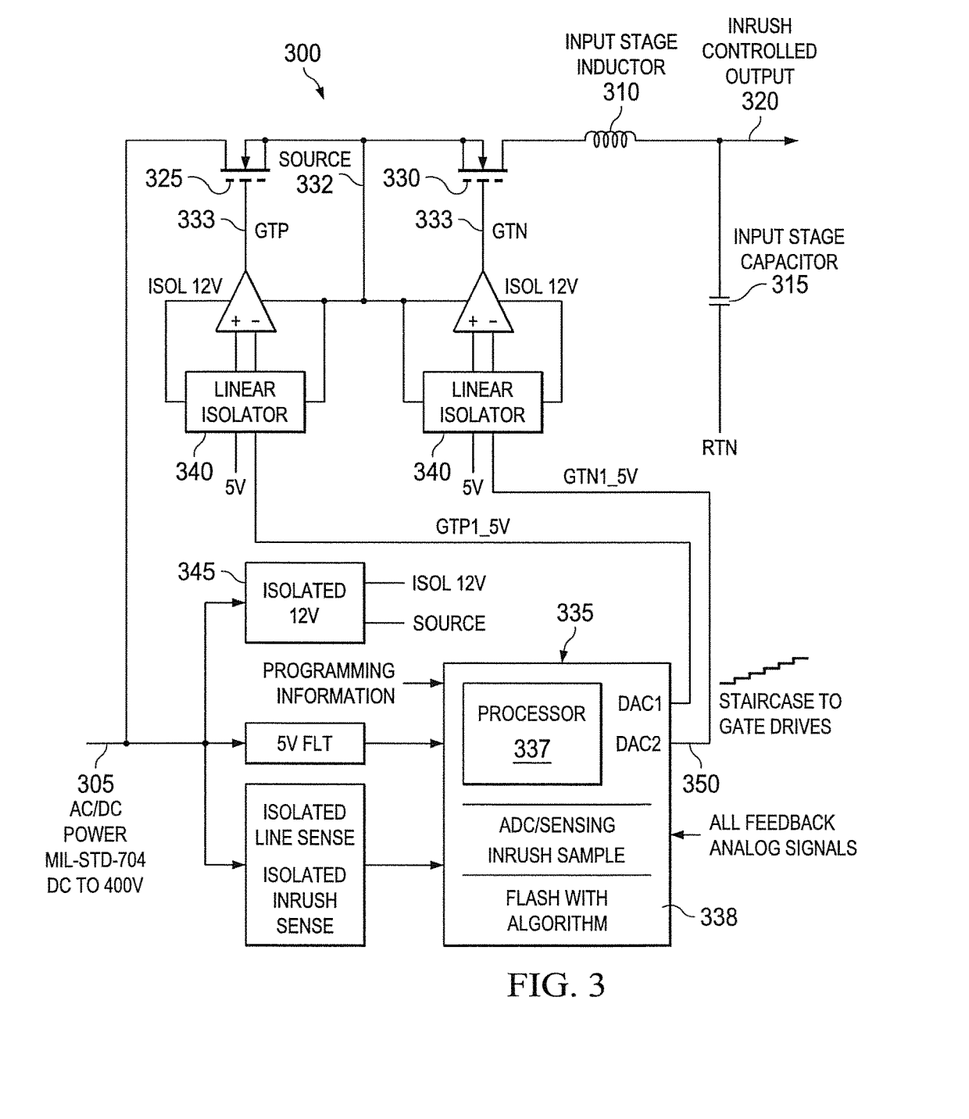
FIG. 3 illustrates an example system for adaptive control of inrush current according to this disclosure.

FIG. 3 illustrates an example system 300 for adaptive control of inrush current according to this disclosure. As shown in FIG. 3, the system 300 includes a power input 305, an input stage inductor 310, an input stage capacitor 315, and an inrush-controlled output 320. The output 320 is controlled by two MOSFET devices 325-330, which are controlled by a controller 335.

The power input 305 is configured to receive power from at least one power supply. In some embodiments, the system 300 is "universal" in approach, so the power input 305 can be coupled to an AC or DC power supply. In the case of an AC power supply, the power input 305 could be coupled to a single-phase or three-phase AC power supply. The system 300 can be designed for high voltage applications, and the power input 305 could be configured to receive a voltage of several hundred volts (such as greater than 250V) or thousands of volts. Of course, in other embodiments, the power input 305 can receive a lower voltage.

The input stage inductor 310 and the input stage capacitor 315 represent one or more inductive elements and one or more capacitive elements that are typically found in the input stage of a power system. While FIG. 3 shows only one input stage inductor 310 and one input stage capacitor 315, this is merely an example. Other embodiments having more than one input stage inductor 310 or more than one input stage capacitor 315 are within the scope of this disclosure.

The MOSFET devices 325-330 are connected in series and share a common source 332. The MOSFET device 325 controls DC input or the positive going portion of AC input voltage. The MOSFET device 330 accommodates the negative going part of an AC input voltage or serves other important functions such as preventing reverse biasing at the source connection or discharging energy in the hold-up capacitor (with additional circuitry). Each of the MOSFET devices 325-330 has its own gate 333. The gate 333 of the MOSFET device 325 is configured to accommodate the positive going part of an AC input voltage, while the gate 333 of the MOSFET device 330 is configured for the negative going part of an AC input voltage. In particular embodiments, each of the MOSFET devices 325-330 is a very low Rds(ON)N-MOSFET device.

Together, the MOSFET devices 325-330 operate as a dual switch for controlling inrush current through the system 300. The inrush current can be associated with either AC or DC power. The presence of two MOSFET devices 325-330 helps to ensure compatibility of the system 300 with an AC power source. While DC power could technically only require the use of the MOSFET 325, the presence of two MOSFETs having different polarities allows the system 300 to be used with both DC and AC power sources.

The ability of each MOSFET device 325-330 to conduct current is controlled by the voltage applied at the gate 333 of that MOSFET device 325-330. That is, the gate 333 is the controlling input of each MOSFET device 325-330. The input voltage at the gate 333 configures each MOSFET device 325-330 and therefore controls the current that passes through the MOSFET device 325-330. Thus, by putting a very precise voltage at the gates 333, the current through the MOSFET devices 325-330 can be precisely controlled. The voltage at each gate 333 is controlled by the controller 335 as described in greater detail below. In some embodiments, linear isolators 340 provide galvanic isolation between the MOSFET devices 325-330 and the controller 335, and a voltage converter 345 receives power through the power input 305 and reduces the voltage to provide power for the linear isolators 340 and output voltages suitable for power of other components, including integrated circuits.

The voltage at the gate 333 of each MOSFET device 325-330 can be controlled by an algorithm executed at the controller 335. In some embodiments, the algorithm implements a staircase function for the voltages on the MOSFET gates 333, where a step duration, a step height, and a total duration of the staircase are dynamically computed by the controller 335. In this example, the controller 335 includes at least one processing device 337 for executing the algorithm, such as a digital signal processor (DSP), microprocessor, microcontroller, field programmable gate array (FPGA), application specific integrated circuit (ASIC), or discrete circuitry. The controller 335 also includes at least one memory 338, such as a Flash memory, for storing the algorithm.

In one aspect of operation, the controller 335 senses an input voltage, a type of power supply (such as DC or AC), and a current in the power path from the power input 305. The controller 335 executes an algorithm that uses this data to adaptively generate a voltage staircase function or other voltage function that is output through two digital-to-analog converters (DACs) 350. The voltage staircase function is sent from the DACs 350 to the gates 333 of the MOSFET devices 325-330 as needed, thereby resulting in voltages on the gates 333 that are controlled by the controller 335. The staircase function can be updated in real-time using closed-loop feedback of the controlled current and voltage as described in greater detail below. The outputs of the DACs 350 are coupled to the MOSFET devices 325-330 through the linear isolators 340.

Figure 4:
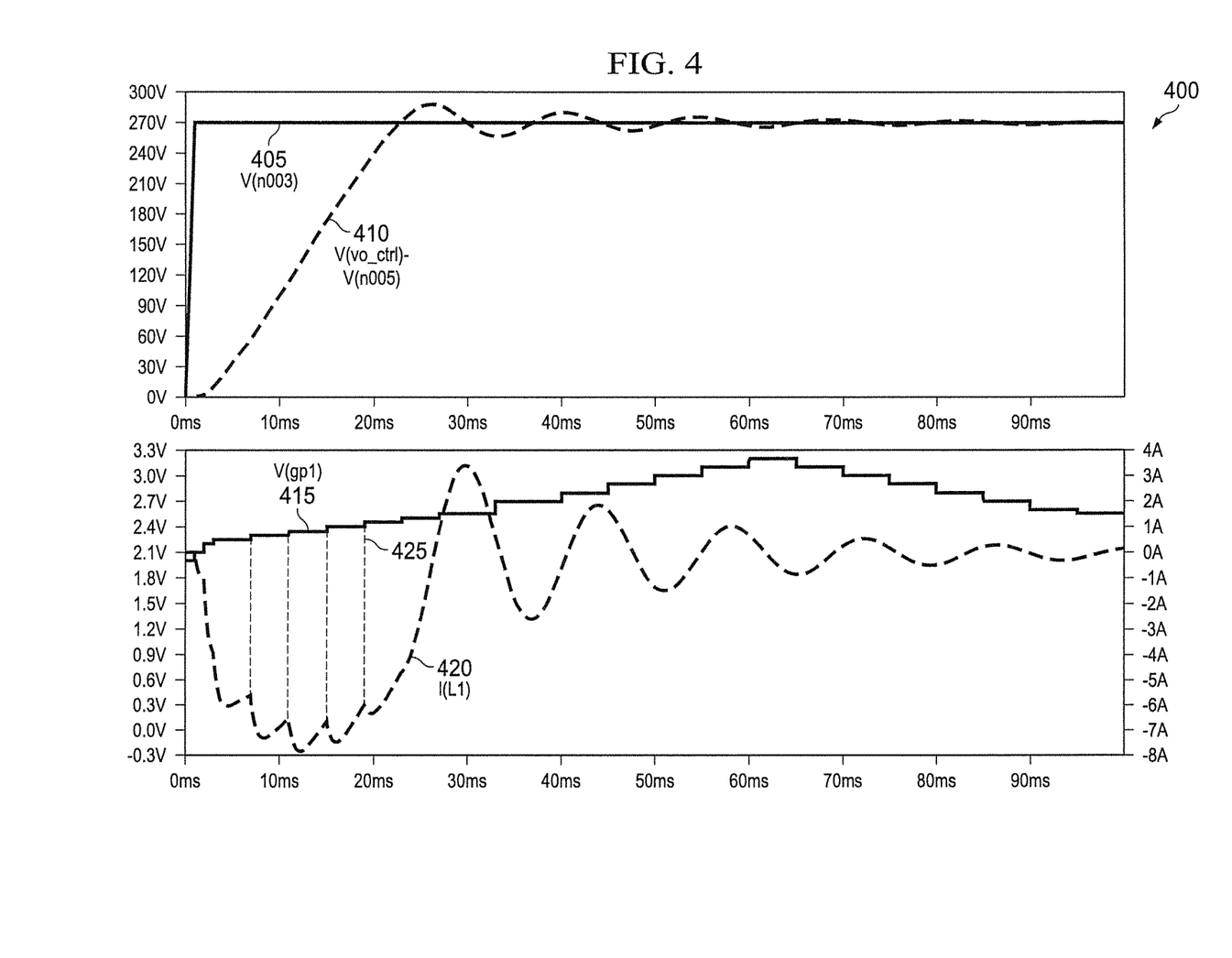
FIGS. 4 and 5 illustrate charts showing example simulation results obtained using the system of FIG. 3 to control inrush current according to this disclosure.
Figure 5:
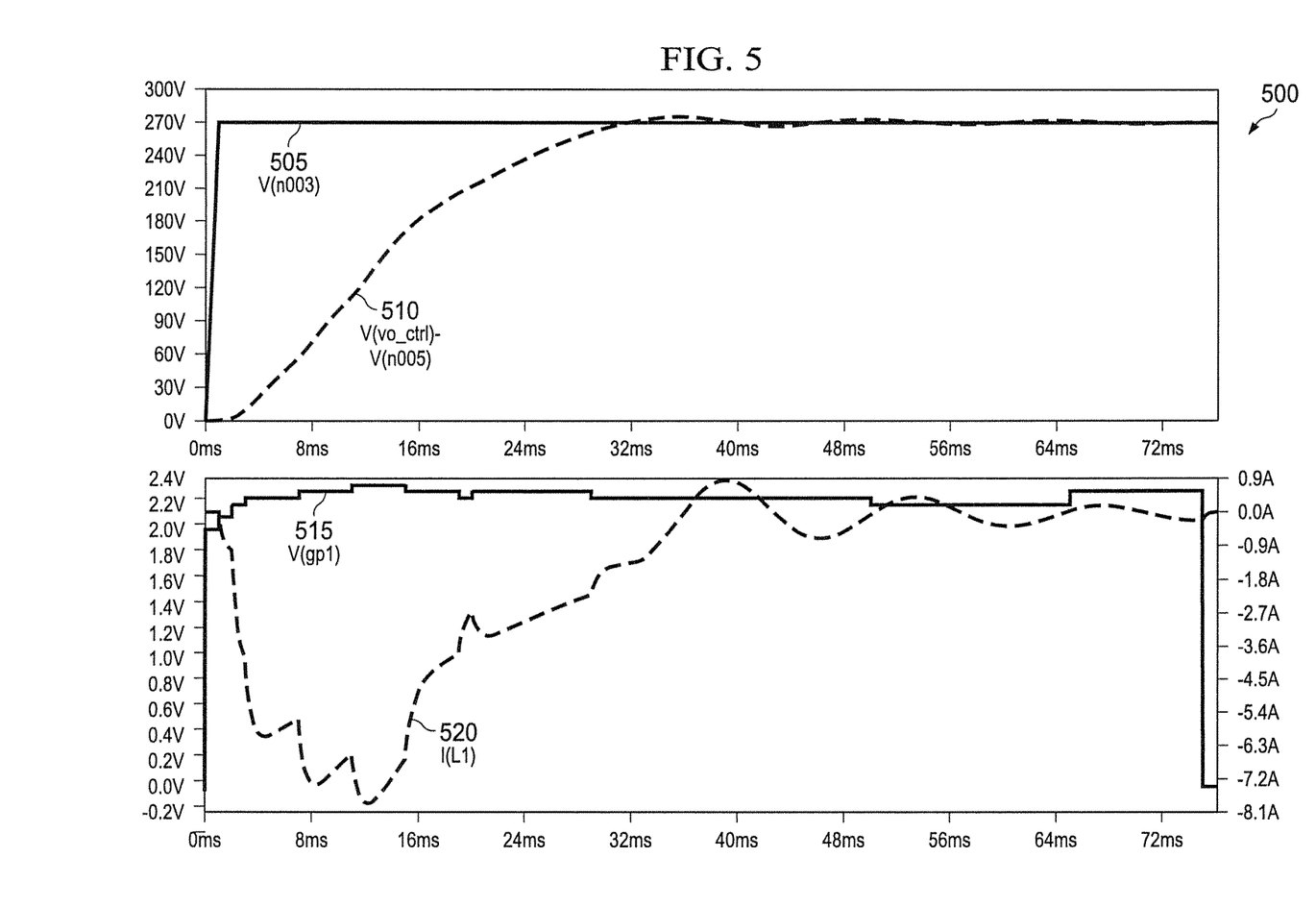

FIGS. 4 and 5 illustrate charts 400 and 500 showing example simulation results obtained using the system 300 of FIG. 3 to control inrush current according to this disclosure. Each of the charts 400 and 500 depicts an input voltage plot 405 and 505, a capacitor voltage plot 410 and 510, a MOSFET gate voltage staircase plot 415 and 515, and a controlled current plot 420 and 520. Each of these plots is plotted over time, starting from the moment when power is received at the power input 305.

The input voltage plots 405 and 505 represent input voltages, such as the voltages at the power input 305. In the examples shown in FIGS. 4 and 5, a DC power source is used, although similar results can be obtained in AC power systems. The capacitor voltage plots 410 and 510 represent the voltages across a capacitor downstream from the MOSFET devices 325-330, such as the capacitor 315. The controlled current plots 420 and 520 represent the currents through the MOSFET devices 325-330, which are controlled based on the operations of the MOSFET devices 325-330. The MOSFET devices 325-330 are controlled by the MOSFET gate voltages represented by the plots 415 and 515.

The MOSFET gate voltage staircase plots 415 and 515 represent the input voltages applied to the gates 333 of the MOSFET devices 325-330. As shown in FIGS. 4 and 5, the MOSFET gate voltage staircase plots 415 and 515 are staircase functions with "steps" that vary in height (such as by changing in voltage) and duration. The height (or amplitude) and duration of each step in the MOSFET gate voltage staircase plots 415 and 515 can be determined using the algorithm executed by the controller 335. The height and duration of each step can be independent of those of other steps, so steps can have the same or different heights, the same or different durations, or any combination of these. Initial values for the step height and duration can be predictively estimated in advance (such as upon sensing of user inputs at the input port), but the steps can be updated in real-time based on a feedback control loop in the system 300.

The feedback control loop repeatedly considers the present values of the input voltage (plot 405 or 505), the MOSFET current (plot 420 or 520), and the capacitor voltage (plot 410 or 510) to determine a next value of the MOSFET gate voltage staircase (plot 415 or 515). For example, in some embodiments, the feedback control loop measures the applied input voltage and the capacitor voltage, measures the difference between the voltages, and measures the MOSFET current. From these measurements, the algorithm determines what the next step of the MOSFET gate voltage staircase should be. Once the next step of the staircase is determined, the voltage at the MOSFET gates 333 is updated. This changes the operation of the MOSFET device 325-330, which results in a change to the MOSFET current. For example, in FIG. 4, the vertical dashed lines 425 show the correlation between changes in the MOSFET gate voltage and the resulting changes in the MOSFET current.

When the capacitor voltage achieves a near steady-state value with respect to the input voltage, the MOSFET current is substantially controlled and the steps of the MOSFET gate voltage staircase can start to go down, thus lowering the applied voltage at the MOSFET gates 333. Such a voltage decrease is unusual compared to typical inrush current control systems, which operate only with voltage increases.

It is noted that, in FIG. 4, the controlled current plot 420 goes both substantially negative and substantially positive over time. However, in FIG. 5, due to the algorithm selecting different values for the MOSFET gate voltage staircase plot 515, the controlled current plot 520 is primarily in the negative direction, with only a small current in the positive direction. Thus, the algorithm can eliminate or substantially eliminate bipolar currents in electrolytic capacitors. In addition, the algorithm can prevent substantial overshoot across the capacitor 315 acting as if as a damped filter. This substantially improves power converter stability.

In some embodiments, the MOSFET devices 325-330 are kept in resistive mode during periods when the MOSFET devices 325-330 operate to control inrush current so that the MOSFET devices 325-330 do not dissipate excessive power. This helps to reduce or minimize thermal effects in the system 300. This also allows repeated turn-on events with a period determined by the voltage staircase function programmed for the algorithm.

In some embodiments, the MOSFET devices 325-330 are external to the controller 335, which allows the MOSFET devices 325-330 to be added in line within an existing input stage of a system 300. This also allows some flexibility in the selection of the particular MOSFETs used. For example, different MOSFETs may be selected depending on the type of power source (DC or AC), the type of downstream power converter/inverter, or the presence of one or more motors in the system 300. In particular embodiments, the MOSFET devices 325-330 could represent N-MOSFETs, P-MOSFETs, Gallium Nitride (GaN) transistors, Silicon Carbide (SiC) transistors, insulated-gate bipolar transistors (IGBTs), thyristors, and the like.

In some embodiments, the algorithm executed by the controller 335, such as parameters associated with the algorithm, can be customized in advance based on input from a user. This allows customization of the inrush current control for particular applications.

Note that while FIG. 3 shows the system 300 with a programmable processor-based controller 335, it is possible in other embodiments to construct a feedback system using discrete electronic components without using a processor-based controller. In these embodiments, the algorithm for controlling the inrush current could essentially be "hard wired" according to the components used. While such a system can be simple, the system would not be as flexible and "user friendly" and could be suitable only for a specific application.

In other embodiments, the system 300 could be implemented as a fully integrated circuit of a "mix-signal analog-digital" genre, which is becoming very common. Such a system would be more expensive but be highly reliable and would offer a high degree of integration. In still other embodiments, the system 300 can be integrated using standard IC processes. Linear isolation can be performed similar to techniques used in most common "high side" switches in commonly used DC-DC converters/inverters.

Although FIG. 3 illustrates one example of a system 300 for adaptive control of inrush current, various changes may be made to FIG. 3. For example, while not specifically shown in FIG. 3, the system 300 can include one or more resistive elements or power dissipating elements. In general, the makeup and arrangement of the system 300 are for illustration only. Components could be added, omitted, combined, or placed in any other configuration according to particular needs. Although FIGS. 4 and 5 illustrate charts 400 and 500 showing example results obtained using the system 300 of FIG. 3 to control inrush current, various changes may be made to FIGS. 4 and 5. For instance, the signals shown in FIGS. 4 and 5 are examples only and are merely meant to represent possible (but not limiting) operations of the system 300.

Figure 6:
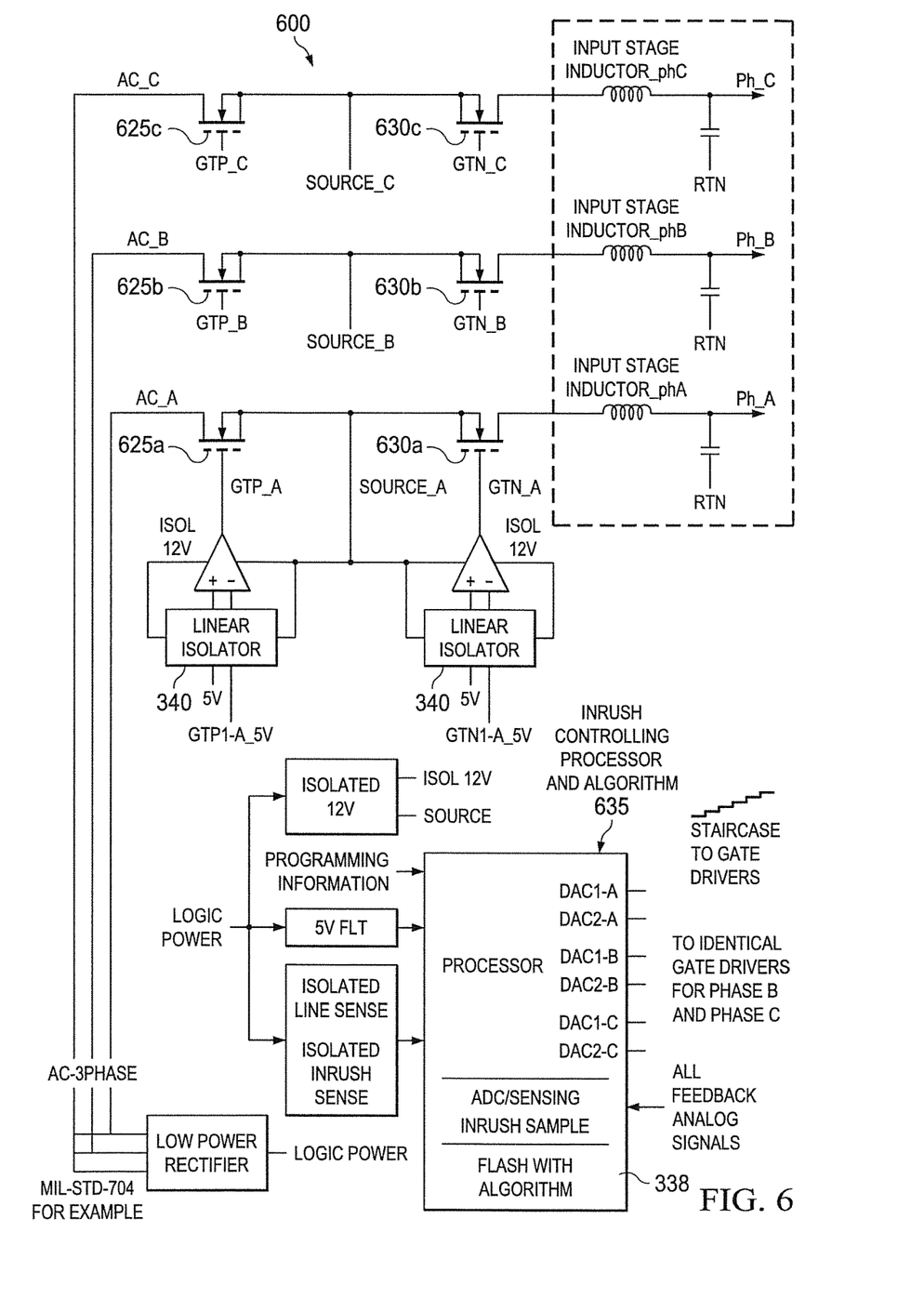
FIG. 6 illustrates another example system for adaptive control of inrush current according to this disclosure.

FIG. 6 illustrates another example system 600 for adaptive control of inrush current according to this disclosure. As shown in FIG. 6, the system 600 is similar to the system 300 of FIG. 3 and includes many identical or similar components. Accordingly, a detailed description of those components will not be repeated here.

The system 600 here is adapted for three-phase AC power. The three phases are identified in FIG. 6 by the letters A, B, and C. Many aerospace applications and other applications use three-phase AC power, and the system 600 can be advantageous in those types of applications. To control inrush current for each phase, the system 600 uses six MOSFET devices 625a-625c, 630a-630c. Two MOSFETs are used for each phase as shown in FIG. 6. A controller 635 operates in a manner similar to the controller 335 of FIG. 3, but the controller 635 here is configured to provide a staircase voltage for each of the three phases A-C.

Although FIG. 6 illustrates another example of a system 600 for adaptive control of inrush current, various changes may be made to FIG. 6. For example, various changes are described with respect to FIG. 3 above and could also be used here. Also, the makeup and arrangement of the system 600 are for illustration only. Components could be added, omitted, combined, or placed in any other configuration according to particular needs.

As described above, the disclosed embodiments provide safe and predictable control of EMI associated with high-voltage conditions. Some embodiments of this disclosure can be configured to support the integration of a "bias" voltage inherently found in many complex power systems. Also, some embodiments of this disclosure can be configured to allow for a rapid discharge of an input stage capacitor. Moreover, some embodiments of this disclosure provide for controlled recharge under repetitive pulse load conditions.

Figure 7:
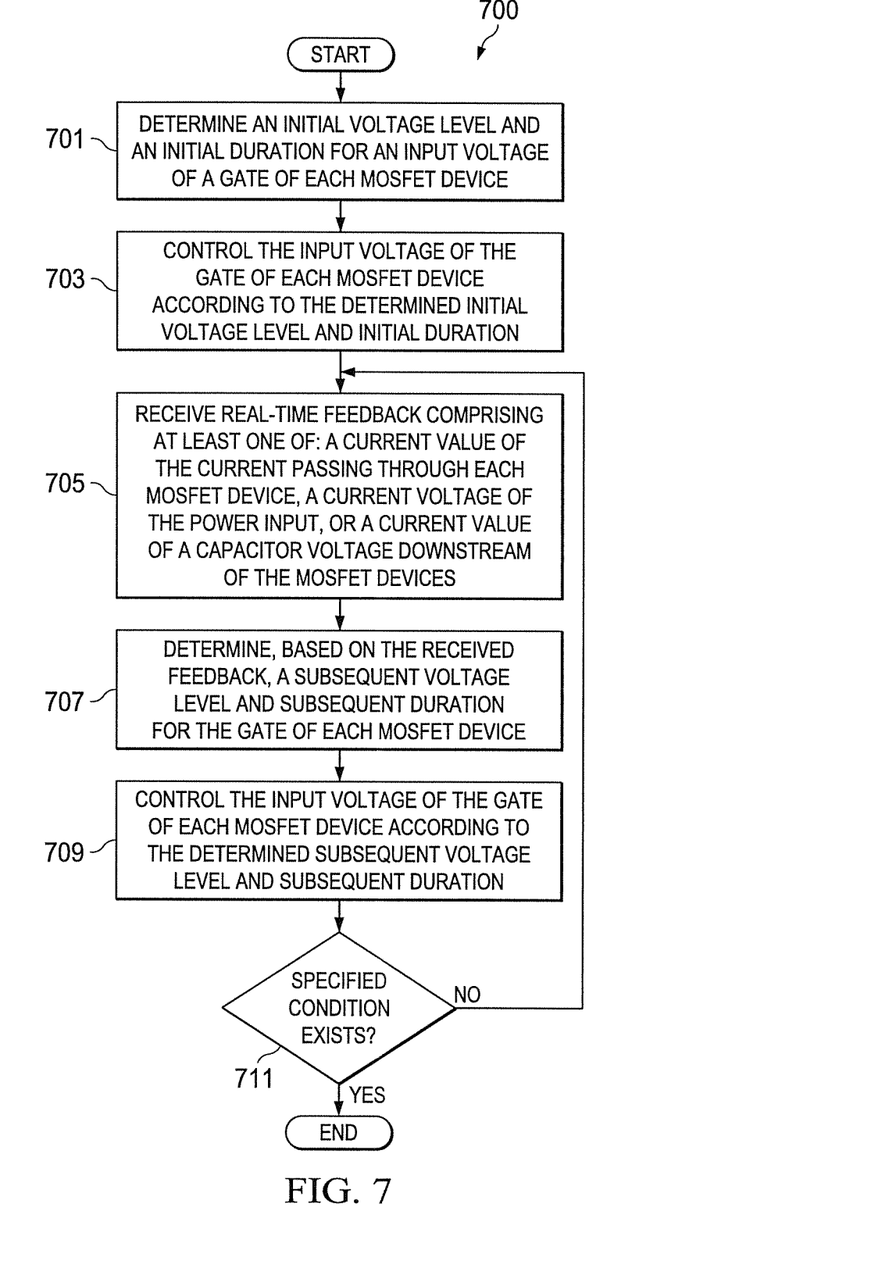
FIG. 7 illustrates an example method for adaptive control of inrush current according to this disclosure.

FIG. 7 illustrates an example method 700 for adaptive control of inrush current according to this disclosure. For ease of explanation, the method 700 is described as being performed using the system 300 of FIG. 3 or the system 600 of FIG. 6. However, the method 700 could be used with any other suitable device or system.

At step 701, an initial voltage level and an initial duration for an input voltage of a gate of each of multiple MOSFET devices is determined. Each MOSFET device is configured to receive a power input and to control a current passing through the MOSFET device, where the current is associated with the power input. This may include, for example, the controller 335 using an algorithm to determine an initial voltage level and initial duration for the input voltage of the gates 333 of the MOSFET devices 325-330.

At step 703, the input voltage of the gate of each MOSFET device is controlled according to the determined initial voltage level and initial duration. This may include, for example, the controller 335 controlling the input voltage of the gates 333 of the MOSFET devices 325-330 for an initial duration.

At step 705, real-time feedback is received. The real-time feedback can include a present value of the current passing through each MOSFET device, a present voltage of the power input, a present value of a capacitor voltage downstream of the MOSFET devices, or any combination of two or more of these. This may include, for example, the controller 335 receiving, in real-time, present values of the input voltage, the MOSFET current, and the capacitor voltage.

At step 707, based on the received feedback, a subsequent voltage level and subsequent duration for the gate of each MOSFET device is determined. This may include, for example, the controller 335 determining a subsequent voltage level and subsequent duration for the input voltage of the gates 333 of the MOSFET devices 325-330.

At step 709, the input voltage of the gate of each MOSFET device is controlled according to the determined subsequent voltage level and subsequent duration. This may include, for example, the controller 335 controlling the input voltage of the gates 333 of the MOSFET devices 325-330 for the subsequent duration.

At step 711, it is determined whether a specified condition exists, such as detection of a steady-state current through the MOSFET devices 325-330, a steady-state voltage on the capacitor 315, expiration of a time period during which inrush current control is performed, or any other suitable condition. If the specified condition exists, then the method 700 ends. However, if the specified condition does not exist, then the method 700 returns to step 705. Thus, steps 705 through 711 can be repeated in a loop any number of times. In some embodiments, the loop can continue indefinitely without a specific check for a specified condition.

Although FIG. 7 illustrates one example of a method 700 for adaptive control of inrush current, various changes may be made to FIG. 7. For example, while shown as a series of steps, various steps shown in FIG. 7 could overlap, occur in parallel, occur in a different order, or occur multiple times.

Moreover, some steps could be combined or removed and additional steps could be added according to particular needs.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," or "system" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
    determining an initial voltage level and an initial duration for an input voltage of a gate of each of multiple transistor devices, each transistor device configured to receive a power input and control a current passing through the transistor device, the current associated with the power input;
    controlling the input voltage of the gate of each transistor device according to the determined initial voltage level and initial duration;
    receiving real-time feedback comprising at least one of: a present value of the current passing through each transistor device, a present voltage of the power input, and a present value of a capacitor voltage downstream of the transistor devices;
    determining, based on the received feedback, a subsequent voltage level and subsequent duration for the input voltage of the gate of each transistor device;
    controlling the input voltage of the gate of each transistor device according to the determined subsequent voltage level and subsequent duration; and
    repeating the receiving of the real-time feedback, the determining of the subsequent voltage level and subsequent duration, and the controlling of the input voltage according to the determined subsequent voltage level and subsequent duration,
    wherein the initial voltage level and the subsequent voltage level for the gate of each transistor device are represented over time as a staircase function having a plurality of steps.

2. The method of claim 1, wherein an amplitude and duration of each step is independent of amplitudes and durations of other steps.

3. The method of claim 1, wherein:
    the steps of the staircase function go up and down over time; and
    a down step is associated with a decreased voltage level for the gates.

4. The method of claim 1, wherein each transistor device comprises one of: an n-type metal oxide semiconductor field effect transistor (MOSFET), a p-type MOSFET, a Gallium Nitride (GaN) transistor, a Silicon Carbide (SiC) transistor, an insulated-gate bipolar transistor (IGBT), and a thyristor.

5. The method of claim 1, wherein the transistor devices comprise two transistors connected in series and sharing a common source, each transistor configured with a different polarity.

6. The method of claim 1, wherein:
    the power input comprises a three-phase alternating current (AC) power; and
    the transistor devices comprise two transistors for each of the three phases of AC power.

7. The method of claim 1, wherein the power input has a voltage of at least 250 volts.

8. The method of claim 1, wherein the steps of the staircase function rise over time from the initial voltage level to a second voltage level higher than the initial voltage level, then descend over time to a third voltage level lower than the second voltage level.

9. A system comprising:
    multiple transistor devices each configured to receive a power input and control a current passing through the transistor device, the current associated with the power input; and
    a controller configured to:
        determine an initial voltage level and an initial duration for an input voltage of a gate of each transistor device;
        control the input voltage of the gate of each transistor device according to the determined initial voltage level and initial duration;

receive real-time feedback comprising at least one of: a present value of the current passing through each transistor device, a present voltage of the power input, and a present value of a capacitor voltage downstream of the transistor devices;

determine, based on the received feedback, a subsequent voltage level and subsequent duration for the input voltage of the gate of each transistor device;

control the input voltage of the gate of each transistor device according to the determined subsequent voltage level and subsequent duration; and repeat the receiving of the real-time feedback, the determining of the subsequent voltage level and subsequent duration, and the controlling of the input voltage according to the determined subsequent voltage level and subsequent duration, wherein the initial voltage level and the subsequent voltage levels for the gate of each transistor device are represented over time as a staircase function having a plurality of steps.

10. The system of claim 9, wherein an amplitude and duration of each step is independent of amplitudes and durations of other steps.

11. The system of claim 9, wherein:

the steps of the staircase function go up and down over time; and a down step is associated with a decreased voltage level for the gates.

12. The system of claim 9, wherein each transistor device comprises one of: an n-type metal oxide semiconductor field effect transistor (MOSFET), a p-type MOSFET, a Gallium Nitride (GaN) transistor, a Silicon Carbide (SiC) transistor, an insulated-gate bipolar transistor (IGBT), and a thyristor.

13. The system of claim 9, wherein the transistor devices comprise two transistors connected in series and sharing a common source, each transistor configured with a different polarity.

14. The system of claim 9, wherein:

the power input comprises a three-phase alternating current (AC) power; and the transistor devices comprise two transistors for each of the three phases of AC power.

15. The system of claim 9, wherein the power input has a voltage of at least 250 volts.

16. A non-transitory computer readable medium containing instructions that, when executed by at least one processing device, cause the at least one processing device to:

determine an initial voltage level and an initial duration for an input voltage of a gate of each of multiple transistor devices, each transistor device configured to receive a power input and control a current passing through the transistor device, the current associated with the power input;

control the input voltage of the gate of each transistor device according to the determined initial voltage level and initial duration;

receive real-time feedback comprising at least one of: a present value of the current passing through each transistor device, a present voltage of the power input, and a present value of a capacitor voltage downstream of the transistor devices;

determine, based on the received feedback, a subsequent voltage level and subsequent duration for the input voltage of the gate of each transistor device;

control the input voltage of the gate of each transistor device according to the determined subsequent voltage level and subsequent duration; and repeat the receiving of the real-time feedback, the determining of the subsequent voltage level and subsequent duration, and the controlling of the input voltage according to the determined subsequent voltage level and subsequent duration, wherein the initial voltage level and the subsequent voltage levels for the gate of each transistor device are represented over time as a staircase function having a plurality of steps.

17. The non-transitory computer readable medium of claim 16, wherein an amplitude and duration of each step is independent of amplitudes and durations of other steps.

18. The non-transitory computer readable medium of claim 16, wherein:

the steps of the staircase function go up and down over time; and a down step is associated with a decreased voltage level for the gates.

19. The non-transitory computer readable medium of claim 16, wherein each transistor device comprises one of: an n-type metal oxide semiconductor field effect transistor (MOSFET), a p-type MOSFET, a Gallium Nitride (GaN) transistor, a Silicon Carbide (SiC) transistor, an insulated-gate bipolar transistor (IGBT), and a thyristor.

20. The non-transitory computer readable medium of claim 16, wherein the transistor devices comprise two transistors connected in series and sharing a common source, each transistor configured with a different polarity.

* * * * *